United States Patent
Hunt

(10) Patent No.: US 8,129,241 B2
(45) Date of Patent: Mar. 6, 2012

(54) METHOD FOR FORMING A SHIELDED GATE TRENCH FET

(75) Inventor: Scott L. Hunt, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/958,689

(22) Filed: Dec. 2, 2010

(65) Prior Publication Data

US 2011/0081773 A1  Apr. 7, 2011

Related U.S. Application Data

(62) Division of application No. 12/146,791, filed on Jun. 26, 2008, now Pat. No. 7,872,305.

(51) Int. Cl.
*H01L 21/336* (2006.01)
(52) U.S. Cl. ............... 438/259; 438/270; 257/E21.655
(58) Field of Classification Search .................. 438/259, 438/270, 271, 587; 257/E21.655
See application file for complete search history.

(56) References Cited

U.S. PATENT DOCUMENTS

| | | |
|---|---|---|
| 6,351,018 B1 | 2/2002 | Sapp |
| 6,861,296 B2 | 3/2005 | Hurst et al. |
| 7,005,353 B2 | 2/2006 | Kocon et al. |
| 7,091,573 B2 | 8/2006 | Hirler et al. |
| 7,872,305 B2 | 1/2011 | Hunt |
| 2004/0031987 A1 | 2/2004 | Henninger et al. |
| 2006/0170062 A1 | 8/2006 | Kim et al. |
| 2006/0267090 A1 | 11/2006 | Sapp et al. |
| 2006/0273386 A1 | 12/2006 | Yilmaz et al. |

OTHER PUBLICATIONS

Requirement for Restriction/Election for U.S. Appl. No. 12/146,791, mailed on Feb. 1, 2010, 9 pages.
Non-Final Office Action for U.S. Appl. No. 12/146,791, mailed on Apr. 15, 2010, 13 pages.
Notice of Allowance for U.S. Appl. No. 12/146,791. Mailed on Sep. 17, 2010, 6 pages.

*Primary Examiner* — Hoai V Pham
(74) *Attorney, Agent, or Firm* — Kilpatrick Townsend & Stockton LLP

(57) ABSTRACT

A method for forming a shielded gate field effect transistor (FET) includes forming a plurality of trenches in a semiconductor region and forming a shield electrode in a bottom portion of each trench. The method also includes forming a dielectric layer comprising a first oxide layer and a nitride layer both laterally extending over the shield electrode. The method also includes forming a gate electrode over the dielectric layer.

19 Claims, 4 Drawing Sheets

METHOD FOR FORMING A SHIELDED GATE TRENCH FET

CROSS-REFERENCE TO RELATED APPLICATIONS

This application is a divisional of U.S. application Ser. No. 12/146,791, filed Jun. 26, 2008, the disclosure of which is incorporated herein by reference in its entirety for all purposes.

BACKGROUND

The present invention relates in general to semiconductor technology, and more particularly to structures and methods for forming inter-electrode dielectrics (IEDs) and gate dielectrics in shielded gate trench field effect transistors (FETs).

Shielded gate trench FETs are advantageous over conventional FETs in that the shield electrode reduces the gate-drain capacitance (Cgd) and improves the breakdown voltage of the transistor without sacrificing on-resistance. Conventional shielded gate trench FETs include a shield electrode below a gate electrode. The shield and gate electrodes are insulated from each other by a dielectric layer referred to as an inter-electrode dielectric or IED. The gate electrode is insulated from its adjacent body regions by a gate dielectric. Conventional methods for forming the IED and gate dielectric include thermal oxidation and/or chemical vapor deposition (CVD) processes.

Conventional shielded gate trench FETs suffer from a number of drawbacks. The gate electrodes have sharp bottom corners that lead to high electric field, which may increase gate leakage. In addition, an IED or gate dielectric formed by thermal oxidation results in consumption of the mesa region between adjacent trenches and along the trench sidewalls, which leads to critical dimension (CD) loss. Also, an IED or gate dielectric formed by CVD has relatively high interface charges and dielectric trap charges, which increase leakage and reduce dielectric quality.

Thus, there is a need for structures and methods for forming shielded gate trench FETs with improved IED and gate dielectric layers.

BRIEF SUMMARY

In accordance with an embodiment of the invention, a shielded gate field effect transistor (FET) comprises a plurality of trenches extending into a semiconductor region. A shield electrode is disposed in a bottom portion of each trench, and a gate electrode is disposed over the shield electrode in each trench. An inter-electrode dielectric (IED) extends between the shield electrode and the gate electrode. The IED comprises a first oxide layer and a nitride layer over the first oxide layer.

In one embodiment, the shielded gate FET further comprises a shield dielectric lining the lower sidewalls and the bottom of each trench. Top surfaces of the shield dielectric are recessed relative to a top surface of the shield electrode so as to form recesses that are adjacent to the opposing sides of the shield electrode. The first oxide layer and the nitride layer fill the recesses.

In another embodiment, the first oxide layer and the nitride layer overlap the shield electrode along a depth of the plurality of trenches.

In another embodiment, the shielded gate FET further comprises a gate dielectric extending between the gate electrode and the semiconductor region. The gate dielectric comprises a first oxide layer and a nitride layer over the first oxide layer.

In another embodiment, the nitride layer in the IED and in the gate dielectric are contiguous.

In another embodiment, the gate dielectric further comprises a second oxide layer vertically extending between the gate electrode and the nitride layer.

In yet another embodiment, the IED further comprises a second oxide layer over the nitride layer.

In accordance with another embodiment of the invention, a shielded gate FET is formed as follows. A plurality of trenches is formed in a semiconductor region. A shield electrode is formed in a bottom portion of each trench. A dielectric layer is formed comprising a first oxide layer and a nitride layer that both laterally extend over the shield electrode. A gate electrode is formed over the shield electrode.

In one embodiment, forming the dielectric layer comprises forming the first oxide layer, forming the nitride layer over the first oxide layer, and forming a second oxide layer over the nitride layer.

In another embodiment, a shield dielectric layer is formed lining the lower sidewalls and the bottom of each trench. The top surfaces of the shield dielectric layer are recessed relative to a top surface of the shield electrode so as to form recesses adjacent to the opposing sides of the shield electrode. The first oxide layer and the nitride layer fill the recesses.

In another embodiment, the nitride layer further extends vertically along the upper sidewalls of each trench between the gate electrode and the semiconductor region.

In another embodiment, the first oxide layer is formed using a thermal oxidation process that also results in formation of an oxide layer vertically extending along the upper sidewalls of each trench.

In yet another embodiment, the thickness of the laterally extending first oxide layer is greater than the thickness of the oxide layer vertically extending along the upper sidewalls of each trench.

The following detailed description and the accompanying drawings provide a better understanding of the nature and advantages of the present invention.

DETAILED DESCRIPTION

In accordance with embodiments of the present invention, the IED and gate dielectric of a shielded gate trench FET include a first oxide layer and a nitride layer. Some embodiments also include a second oxide layer over the nitride layer. The first oxide layer and the nitride layer fill the recesses above the shield dielectric adjacent to the opposing sides of the shield electrode that would otherwise form sharp corners on the bottom of the gate electrode. This reduces the leakage between the shield and gate electrodes. These and other embodiments of the invention as well as other features and advantages are described in more detail below.

FIGS. 1A-1F are simplified cross-sectional views at various stages of a process for forming the IED and gate dielectric layers of a shielded gate trench FET, according to an embodiment of the invention. It should be understood that the following description is exemplary only, and the scope of the invention is not limited to these specific examples. Note that the various dimensions in the figures of this application are not to scale, and at times they are exaggerated or reduced in size to more clearly show various structural features.

Figure 1A:
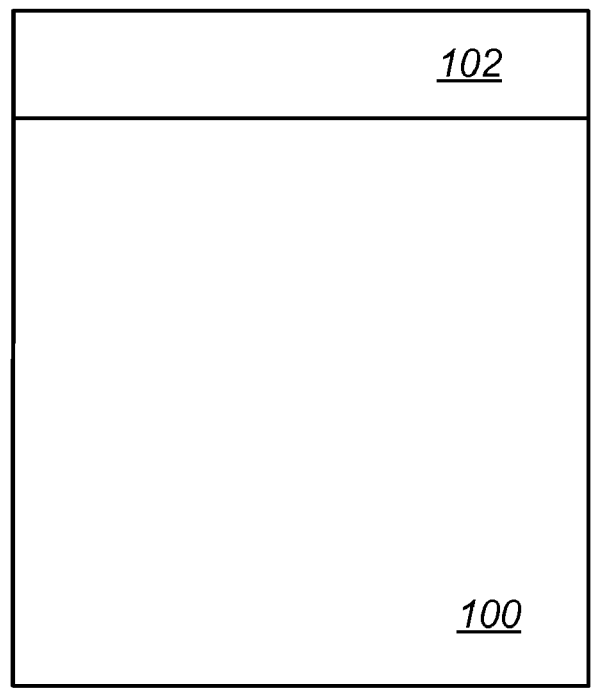
FIGS. 1A-1F are simplified cross-sectional views at various stages of a process for forming the IED and gate dielectric of a shielded gate trench FET, according to an embodiment of the invention.
Figure 1B:
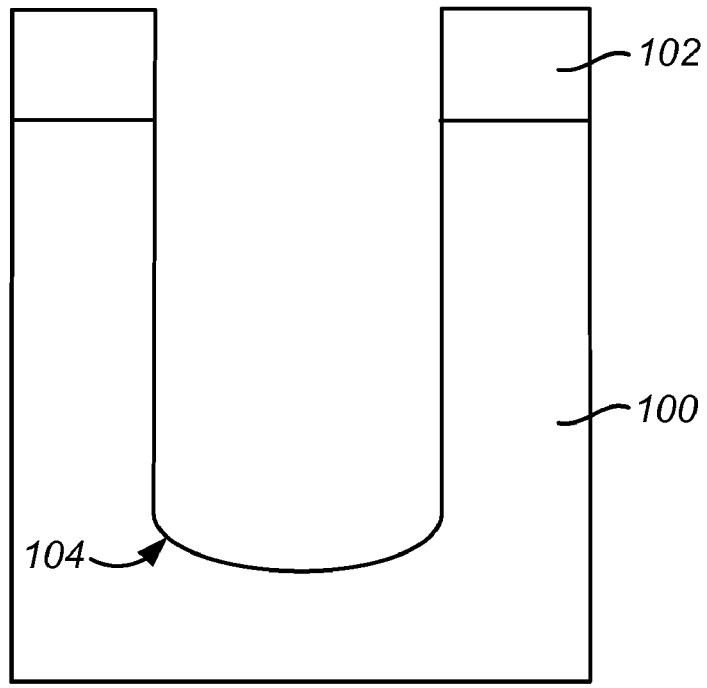

In FIG. 1A, semiconductor region 100 is provided as the basis for forming the shielded gate trench FET. Hard mask 102 is formed over the surface of semiconductor region 100 using known techniques. In one embodiment, hard mask 102 comprises oxide. In FIG. 1B trench 104 is formed in semiconductor region 100 using conventional photolithography and etch techniques. In one embodiment, semiconductor region 100 includes an n-type epitaxial layer formed over a highly doped n+ type substrate. In some embodiments, trench 104 extends into and terminates within the epitaxial layer. In other embodiments, trench 104 extends through the epitaxial layer and terminates within the substrate. Hard mask 102 may be removed following the formation of trench 104.

Figure 1C:
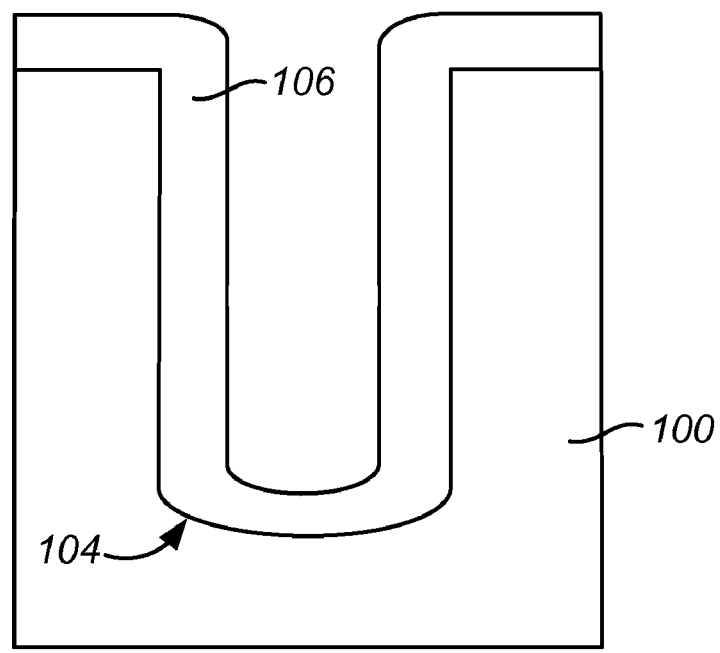

In FIG. 1C, shield dielectric 106 is formed along the sidewalls and the bottom of trench 104 and over the mesa regions adjacent to trench 104 using known techniques. In one embodiment, shield dielectric 106 comprises oxide having a thickness in the range of 700-1300 Å and may be formed using a conventional oxide deposition or thermal oxidation process.

Figure 1D:
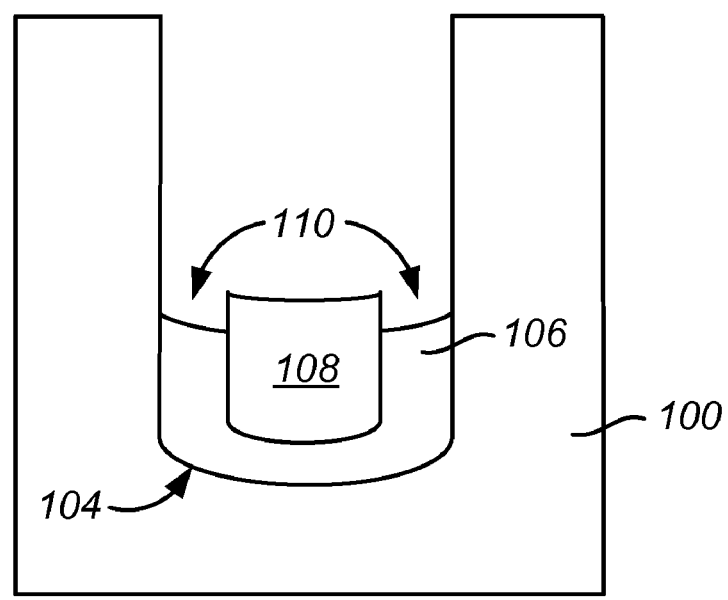

In FIG. 1D, shield electrode 108 is formed in the lower portion of trench 104 over shield dielectric 106 using known techniques. The formation of shield electrode 108 may include depositing a layer of polysilicon over shield dielectric 106 to fill trench 104. The polysilicon may be deposited using conventional polysilicon deposition techniques. The polysilicon may then be etched using known techniques to recess the polysilicon and form shield electrode 108 in the lower portion of trench 104.

The portions of shield dielectric 106 along the upper sidewalls of trench 104 and over the mesa regions adjacent to trench 104 may be removed using known dielectric etch techniques. The dielectric etch process etches shield dielectric 106 such that the top surfaces of shield dielectric 106 are recessed relative to the top surface of shield electrode 108, thus forming recesses 110 between an upper portion of shield electrode 108 and semiconductor region 100.

Figure 1E:
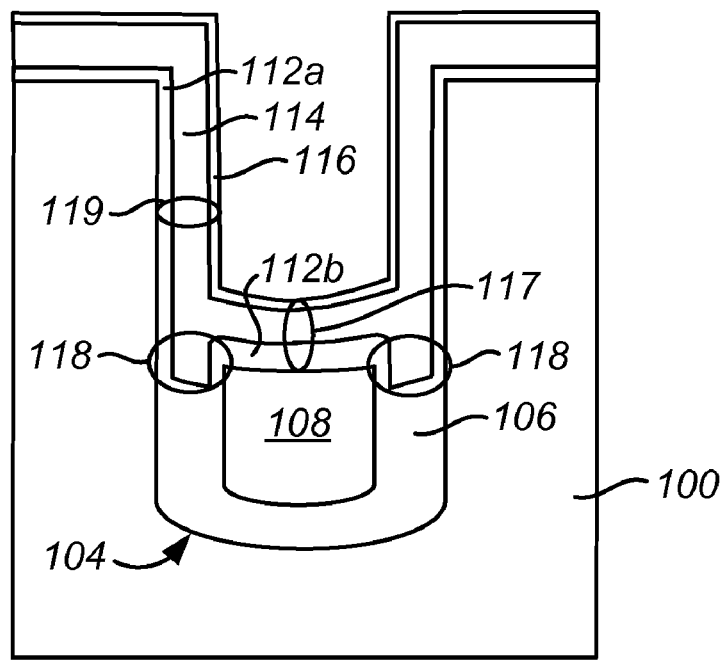

In FIG. 1E, IED 117 and gate dielectric 119 are formed over shield electrode 108 and along upper sidewalls of trench 104. IED 117 and gate dielectric 119 include first oxide layer 112a,b and nitride layer 114. Some embodiments also include second oxide layer 116.

First oxide layer 112a,b is formed along the upper trench sidewalls (portion 112a) and over shield electrode 108 (portion 112b) using known techniques. First oxide layer 112a,b may also cover the mesa regions adjacent to trench 104. In one embodiment, first oxide layer 112a,b may be formed using a conventional thermal oxidation process and have a thickness in the range of 150-300 Å. In some embodiments, it is desirable to have a thicker IED 117 than gate dielectric 119 to reduce leakage between the gate and shield electrodes. In such embodiments, a low temperature thermal oxidation process (e.g., about 850° C.) may be carried out using known techniques so that a thicker oxide layer 112b is formed along the top of the polysilicon shield electrode than oxide layer 112a along the upper trench sidewalls (as shown in FIG. 1E). Using such a process, a thickness ratio in the range of 1.5:1 to 2:1 and higher may be achieved.

Nitride layer 114 is formed over first oxide layer 112a,b. In one embodiment, nitride layer 114 may be formed using a conventional low pressure chemical vapor deposition (LPCVD) process and have a thickness in the range of 200-600 Å. In one embodiment, thicknesses of nitride layer 114 and first oxide layer 112a,b are selected to ensure that nitride layer 114 and first oxide layer 112a,b fill recesses 110. The LPCVD process advantageously reduces CD loss because it does not consume the semiconductor region along the trench sidewalls like a thermal oxidation process.

Figure 1F:
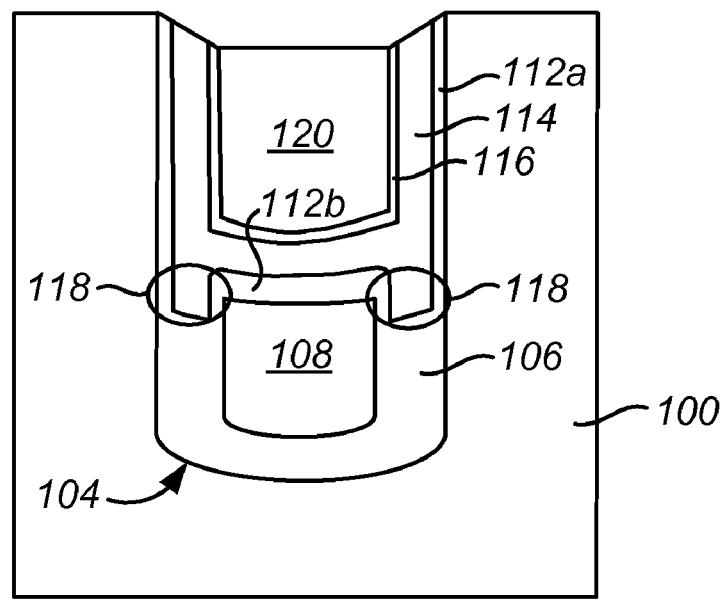

In one embodiment, first oxide layer 112a,b and nitride layer 114 fill recesses 110 to form regions 118 in FIG. 1F. Regions 118 overlap shield electrode 108 along a depth of trench 104. In conventional shielded gate trench FETs, regions 118 are typically filled with polysilicon and thus form sharp corners on the bottom of the gate electrode that lead to a high electric field and increased gate leakage. Filling regions 118 with first oxide layer 112a,b and nitride layer 114 thus lowers the electric field and reduces gate leakage.

Second oxide layer 116 may be formed over nitride layer 114 using conventional methods. In one embodiment, second oxide layer 116 may be formed using a conventional thermal oxidation process and have a thickness in the range of 25-45 Å. Second oxide layer 116 is formed in part because polysilicon gate 120 and nitride layer 114 do not form a good interface.

In FIG. 1F, gate electrode 120 is formed in the upper portion of trench 104. The formation of gate electrode 120 may include depositing a layer of polysilicon over IED 117 and gate dielectric 119 to fill trench 104. The polysilicon may be deposited using conventional polysilicon deposition techniques. The deposited polysilicon is then etched using known techniques to form gate electrode 120 in the upper portion of trench 104. As shown in FIG. 1F, the top of gate electrode 120 may be recessed below the surface of semiconductor region 100. The polysilicon etch may also remove the portions of first oxide layer 112a,b, nitride layer 114, and second oxide layer 116 extending over the mesa regions adjacent to trench 104. In one embodiment, the polysilicon recess etch includes a first polysilicon etch step that stops on second oxide layer 116. A short oxide etch step may follow to remove second oxide layer 116 over the mesa regions. A timed polysilicon etch step may then be used to recess gate electrode 120. This step may also remove nitride layer 114 over the mesa regions, while first oxide layer 112a,b remains and protects the mesa surfaces. A final oxide etch step may be used to remove first oxide layer 112a,b over the mesa regions. Alternatively, the portions of first oxide layer 112a,b, nitride layer 114, and second oxide layer 116 that extend over the mesa regions may be removed following the polysilicon recess etch.

Figure 2:
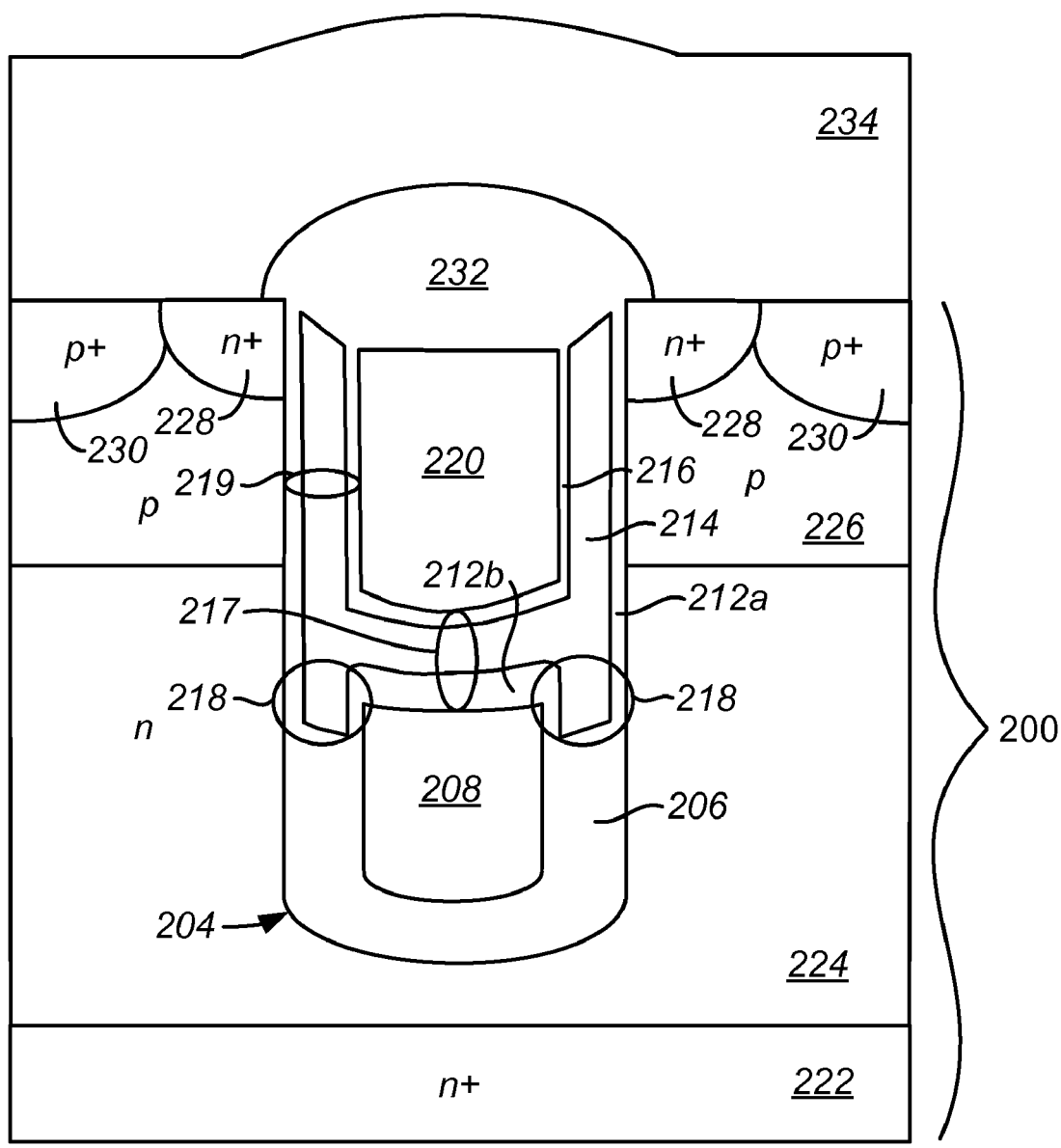
FIG. 2 shows a simplified cross-sectional view of a shielded gate trench FET structure, according to an embodiment of the invention.

The remaining portions of the shielded gate trench FET structure can be formed using any one of a number of known techniques. FIG. 2 shows a simplified cross-sectional view of a more complete shielded gate trench FET structure, according to an embodiment of the invention.

In FIG. 2, semiconductor region 200 includes an n-type drift region 224 over a highly doped n+ type substrate 222. In this embodiment, trench 204 extends into drift region 224. Body regions 226 of p-type conductivity extend over drift region 224. Source regions 228 of n+ type conductivity flank trench 104. In one embodiment, drift region 224 is formed in an upper portion of an n-type epitaxial layer that is formed over substrate 222 using known techniques. Alternatively, source regions 228 and body regions 226 may be formed prior to etching trench 204. Shield dielectric 206, shield electrode 208, gate electrode 220, IED 217, and gate dielectric 219 are all formed using techniques similar to those described in connection with FIGS. 1A-1F.

The cross section in FIG. 2 corresponds to an embodiment where an open cell configuration is used with source regions 228 and trench 204 being stripe-shaped and extending parallel to one another. In this embodiment, conventional techniques are used to form heavy body regions 230 of p+ type conductivity periodically or continuously along the source stripes. A dielectric layer (e.g., BPSG) is formed over the structure and patterned to form dielectric dome 232 following a reflow process. A topside conductive interconnect layer 234 (e.g., comprising metal) that electrically contacts source regions 228 and heavy body regions 230 may be formed over the entire structure. Similarly, a bottom-side conductive interconnect layer (not shown), e.g., comprising metal, that electrically contacts the backside of substrate 222 may be formed using known techniques. The method of the present invention is not limited to an open cell configuration. The implementation of the present invention in a closed cell configuration would be obvious to one skilled in the art in view of this disclosure.

Note that while the embodiment depicted in FIG. 2 shows and n-channel FET, a p-channel FET may be obtained by reversing the polarity of the various semiconductor regions. Further, in embodiments where semiconductor regions 100, 200 include an epitaxial layer extending over a substrate, MOSFETs are obtained where the substrate and epitaxial layer are of the same conductivity type, and IGBTs are obtained where the substrate has the opposite conductivity type to that of the epitaxial layer.

The IED and gate dielectric formed according to embodiments of the invention enjoy, among other advantages and features, reduced CD loss (by using a deposition process for nitride layer 114 that does not consume mesa regions or trench sidewalls), a readily scalable thickness (nitride layer 114 can be made thicker without additional consumption of the mesa regions or trench sidewalls), a lower electric field and reduced gate leakage between the shield and gate electrodes (by filling regions 118 with first oxide layer 112a,b and nitride layer 114 instead of gate polysilicon), relatively low interface charges and dielectric trap charges (by using a thermal oxidation process for first oxide layer 112a,b that is of a higher quality than a deposited film), lower gate leakage and improved dielectric quality (by using a dielectric that includes both oxide and nitride films), reduced thickness sensitivity to variations in doping of shield electrode 108 (by using a deposition process for nitride layer 114 that is less sensitive to variations in doping than a thermal process), reduced dopant diffusion into the dielectric layers (nitride layer 114 acts as a barrier to diffusion), and more robustness to particles and pinholes (using more than one film in the dielectric reduces the probability that defects in each film will be aligned). Further, embodiments of the invention described herein are advantageously simple to implement thus enabling them to be easily integrated with conventional processes. For example, no sacrificial layers are required. Each dielectric film that is deposited remains as part of the final IED and gate dielectric. Additionally, unlike conventional processes, according to an embodiment of the invention the IED and gate dielectric may be formed simultaneously. No additional process steps are required to form the gate dielectric separate from those required for the IED.

Although a number of specific embodiments are shown and described above, embodiments of the invention are not limited thereto. For example, it is understood that the doping polarities of the structures shown and described could be reversed and/or the doping concentrations of the various elements could be altered without departing from the invention. Also, the various embodiments described above may be implemented in silicon, silicon carbide, gallium arsenide, gallium nitride, diamond, or other semiconductor materials. Further, the features of one or more embodiments of the invention may be combined with one or more features of other embodiments of the invention without departing from the scope of the invention.

Therefore, the scope of the present invention should be determined not with reference to the above description but should be determined with reference to the appended claims, along with their full scope of equivalents.

What is claimed is:

1. A method for forming a shielded gate field effect transistor (FET), the method comprising:
   forming a plurality of trenches in a semiconductor region;
   forming a shield electrode in a bottom portion of each trench;
   forming a dielectric layer laterally extending over the shield electrode, the dielectric layer comprising a first oxide layer and a nitride layer over the first oxide layer; and
   forming a gate electrode over the dielectric layer.

2. The method of claim 1 wherein forming the dielectric layer comprises:
   (i) forming the first oxide layer;
   (ii) forming the nitride layer over the first oxide layer; and
   (iii) forming a second oxide layer over the nitride layer.

3. The method of claim 1 further comprising:
   forming a shield dielectric layer lining lower sidewalls and a bottom of each trench, wherein top surfaces of the shield dielectric are recessed relative to a top surface of the shield electrode so as to form recesses adjacent to opposing sides of the shield electrode, the first oxide layer and the nitride layer filling the recesses.

4. The method of claim 3 wherein the first oxide layer and the nitride layer overlap the shield electrode along a depth of the plurality of trenches.

5. The method of claim 1 wherein the nitride layer further extends vertically along upper sidewalls of each trench between the gate electrode and the semiconductor region.

6. The method of claim 5 wherein the first oxide layer is formed using a thermal oxidation process which also results in formation of an oxide layer vertically extending along upper sidewalls of each trench.

7. The method of claim 6 wherein a thickness of the laterally extending first oxide layer is greater than a thickness of the oxide layer vertically extending along the upper sidewalls of each trench.

8. A method for forming a shielded gate field effect transistor (FET), the method comprising:
   forming a plurality of trenches in a semiconductor region;
   forming a shield dielectric lining opposing sidewalls and bottom of each trench;
   forming a shield electrode in a bottom portion of each trench over the shield dielectric;
   recessing the shield dielectric below a top surface of the shield electrode so as to form recesses between an upper portion of the shield electrode and the semiconductor region;
   forming a first oxide layer laterally extending over the shield electrode in each trench, the first oxide layer partially filling the recesses;
   forming a nitride layer over the first oxide layer; and
   forming a gate electrode in an upper portion of each trench over the nitride layer.

9. The method of claim 8 further comprising:
forming a dielectric layer extending between the shield electrode and the gate electrode, the dielectric layer comprising:
(i) the first oxide layer,
(ii) the nitride layer over the first oxide layer, and
(iii) a second oxide layer over the nitride layer, wherein at least the first oxide layer and the nitride layer fill the recesses and overlap the shield electrode along a depth of the plurality of trenches.

10. The method of claim 8 wherein the nitride layer further extends vertically along upper sidewalls of each trench between the gate electrode and the semiconductor region.

11. The method of claim 8 wherein the first oxide layer is formed using a thermal oxidation process which also results in formation of an oxide layer vertically extending along upper sidewalls of each trench.

12. The method of claim 11 wherein a thickness of the laterally extending first oxide layer is greater than a thickness of the oxide layer vertically extending along the upper sidewalls of each trench.

13. A method for forming a shielded gate field effect transistor (FET), the method comprising:
forming a plurality of trenches in a semiconductor region;
forming a shield electrode in a bottom portion of each trench;
forming a first oxide layer laterally extending over the shield electrode;
forming a nitride layer over the first oxide layer; and
forming a gate electrode over the nitride layer.

14. The method of claim 13 further comprising forming a second oxide layer over the nitride layer before forming the gate electrode.

15. The method of claim 13 further comprising:
forming a shield dielectric layer lining lower sidewalls and a bottom of each trench, wherein top surfaces of the shield dielectric are recessed relative to a top surface of the shield electrode so as to form recesses adjacent to opposing sides of the shield electrode, the first oxide layer and the nitride layer filling the recesses.

16. The method of claim 13 wherein the nitride layer further extends vertically along upper sidewalls of each trench between the gate electrode and the semiconductor region.

17. The method of claim 16 wherein the first oxide layer is formed using a thermal oxidation process which also results in formation of an oxide layer vertically extending along upper sidewalls of each trench.

18. The method of claim 17 wherein a thickness of the laterally extending first oxide layer is greater than a thickness of the first oxide layer vertically extending along the upper sidewalls of each trench.

19. The method of claim 1 further comprising forming a second oxide layer over the nitride layer.

* * * * *